(12) United States Patent
Mnich et al.

(10) Patent No.: US 6,590,420 B1
(45) Date of Patent: Jul. 8, 2003

(54) LEVEL SHIFTING CIRCUIT AND METHOD

(75) Inventors: Thomas M. Mnich, Woodland Park, CO (US); Ryan T. Hirose, Colorado Springs, CO (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 10/029,370

(22) Filed: Dec. 20, 2001

(51) Int. Cl.[7] .......................................... H03K 19/0175
(52) U.S. Cl. .......................................... 326/68; 326/81
(58) Field of Search ........................... 326/63, 68, 70, 326/81, 71

(56) References Cited

U.S. PATENT DOCUMENTS

| | | | |
|---|---|---|---|
| 4,978,905 A | 12/1990 | Hoff et al. | 323/314 |
| 5,157,282 A | 10/1992 | Ong et al. | 307/443 |
| 5,502,405 A | 3/1996 | Williams | 326/66 |
| 5,600,267 A | 2/1997 | Wong et al. | 326/73 |
| 5,745,354 A | 4/1998 | Raza | 363/60 |
| 5,872,464 A | 2/1999 | Gradinariu | 326/71 |
| 5,952,868 A | 9/1999 | Gowni et al. | 327/362 |
| 5,973,545 A | 10/1999 | Raza | 327/536 |
| 6,011,421 A * | 1/2000 | Jung | 327/333 |
| 6,404,229 B1 * | 6/2002 | Barnes | 326/68 |

* cited by examiner

Primary Examiner—Don Le
(74) Attorney, Agent, or Firm—Dorsey & Whitney LLP

(57) ABSTRACT

A circuit for shifting a signal from a first voltage level referenced to a first voltage reference, to a second voltage level referenced to a second voltage reference, while reducing the gate to source voltages on the output transistors. In one embodiment, the circuit includes six switches. A first switch receives the signal; a second switch receives an inverted representation of the signal; a third switch receives the output of the first switch; a fourth switch receives the output of the second switch; a fifth switch, referenced to the second voltage reference, has an input coupled with the output of the first switch and a control coupled with the output of the fourth switch; and a sixth switch, referenced to the second voltage reference, has an input coupled with the output of the second switch and has a control coupled with the output of the third switch. In one embodiment, when the third switch and the fourth switch are on, the signal is shifted to the second voltage level measured between the input of the fifth switch and the second voltage reference. The third and fourth switches act to prevent the gate to source voltage on the fifth and sixth switches from reaching a high voltage level, such as 10 volts.

26 Claims, 4 Drawing Sheets

LEVEL SHIFTING CIRCUIT AND METHOD

FIELD OF THE INVENTION

This invention relates to level shifting circuits.

BACKGROUND OF THE INVENTION

A level shifting circuit is used to shift the logic levels of a signal to higher voltages. For example, in a circuit where the logic levels are 0 volts for a "low" logic level and +5 volts for a "high" logic level, a level shifting circuit can be used so that those logic levels are 0 volts for the "low" logic level and +10 volts for the "high" logic level, in one example.

Typically, level shifting circuits are used in non-volatile memories that require the controlled and selective application of a large voltage to program, write or erase portions of the non-volatile memory, such as memory cells.

For example, in a non-volatile memory device which operates with supply voltages of 5 volts, a programming voltage of the magnitude of approximately 10 volts is typically used. For non-volatile memory devices which operate using supply voltages of 3.3 volts, a programming voltage of approximately 10 volts in magnitude is also typically used.

FIG. 1 illustrates an example of a level shifting circuit which shifts the logic levels for an input or data signal IN to higher voltage levels. The signal VNEG is a negative reference signal which can be generated by another circuit (not shown) so that VNEG goes from 0 volts to −5 volts in order to provide a −5 volt reference for the level shifting circuit of FIG. 1.

In overall operation and as shown in Table 1, node A and B are output nodes, wherein node A follows the value of the input or data signal IN, while node B is the complement of the input or data signal IN. When the VNEG reference signal is driven to a negative voltage level, such as −5 volts, then an output signal can be taken across node A with respect to the VNEG signal. If the input signal IN is at a low logic level of 0 volts, then the output measured across the (A to VNEG) node is 0 volts. When the input signal IN is at a high logic level of +5 volts, the voltage at the (A to VNEG) node is +10 volts, meaning that the high logic level for the IN signal has been shifted to +10 volts.

TABLE 1

| IN | VNEG | NODE A | NODE B | (A-VNEG) | (B-VNEG) |
|----|------|--------|--------|----------|----------|
| 0  | 0    | 0      | +5     | 0        | +5       |
| +5 | 0    | +5     | 0      | +5       | 0        |
| 0  | −5   | −5     | +5     | 0        | +10      |
| +5 | −5   | +5     | −5     | +10      | 0        |

As recognized by the present inventors, such a circuit shown in FIG. 1 is problematic in that n-channel transistors 20 and 22—which act as a high voltage switch to drive the output to the higher voltages—may degrade over time due to the fact that the gate to source voltages across these transistors may be 10 volts when the VNEG reference signal is at −5 volts. As the transistors 20, 22 are subjected to numerous programming voltages of, for example, 10 volts between the gate and the source of each transistor, the transistors may degrade over time. If the transistor degrades, the functionality of the integrated circuit incorporating the transistor may not perform in its expected manner, and may even possibly fail due to the degradation of the transistor subjected to the high gate to source voltage.

FIG. 2 illustrates an example of a level shifting circuit wherein p-channel transistors 24, 26 are used for the high voltage output switches. The reference voltage VPOS is generated by a circuit (not shown) which generates a voltage from +5 volts to +10 volts in order to generate an output signal measured across node (A to VPOS), or node (B to VPOS). As recognized by the present inventors, the circuit of FIG. 2 may also be subjected to degradation issues when a −10 volt gate to source voltage is applied to transistors 24 and 26 during level shifting operations.

As recognized by the present inventors, what is needed is a circuit for shifting the voltage levels of an input signal to higher voltage levels, while reducing the gate to source voltages on the high voltage output switching transistors. In this way, due to the reduced bias voltage applied to the gate of the high voltage switching transistors, degradation of the transistors due to the high programming voltages is reduced, thereby improving the performance of the transistors and any device in which the transistors are used.

It is against this background that various embodiments of the present invention were developed.

SUMMARY

According to one broad aspect of one embodiment of the invention, disclosed herein is a circuit for shifting a signal from a first voltage level referenced to a first voltage reference, to a second voltage level referenced to a second voltage reference. In one embodiment, the circuit includes six switches. A first switch receives the signal; a second switch receives an inverted representation of the signal; a third switch receives the output of the first switch; a fourth switch receives the output of the second switch; a fifth switch, referenced to the second voltage reference, has an input coupled with the output of the first switch and a control coupled with the output of the fourth switch; and a sixth switch, referenced to the second voltage reference, has an input coupled with the output of the second switch and has a control coupled with the output of the third switch. In one embodiment, when the third switch and the fourth switch are on, the signal is shifted to the second voltage level measured between the input of the fifth switch and the second voltage reference. The third and fourth switches act to prevent the gate to source voltage on the fifth and sixth switches from reaching a high voltage level, such as 10 volts as shown in FIG. 1.

In one embodiment, the second voltage reference is a high voltage signal of approximately −5 volts, and the first and second switches may be p-channel transistors; the third, fourth, fifth and sixth switches are n-channel transistors. In this embodiment, the circuit can shift an input signal at logic levels, such as 0 to +5 volts, to higher voltage levels of −5 to +5 volts.

In another embodiment, the second voltage reference is a high voltage signal of approximately +10 volts, and the first and second switches may be n-channel transistors; the third, fourth, fifth and sixth switches are p-channel transistors. In this embodiment, the circuit can shift an input signal at logic levels of, for example, 0 to +5 volts, to higher voltage levels of 0 to +10 volts.

The circuit can further include a means for generating a control signal responsive to the level of the second voltage reference. The control signal may be coupled with the third switch and the fourth switch in order to activate the third and fourth switches when the second voltage reference has reached a particular level outside of the logic levels of the circuit (i.e., below 0 volts, or alternatively, above 5 volts).

Also disclosed herein is a method for reducing a voltage applied between a gate and a source of a transistor in a level shifting circuit. The method includes providing a first switch receiving the signal, and providing a second switch receiving an inverted representation of the signal. A first high voltage switch is provided and is referenced to the second voltage reference, and the first high voltage switch has an input coupled with the output of the first switch. A second high voltage switch is provided and referenced to the second voltage reference, the second high voltage switch has an input coupled with the output of the second switch. A third switch is coupled with the output of the first switch and with the control of the second high voltage switch, wherein the third switch responsive to the second reference voltage. A fourth switch is coupled with the output of the second switch and the control of the first high voltage switch, wherein the fourth switch responsive to the second reference voltage. In this manner, when the third switch and the fourth switch are on, the signal is shifted to the second voltage level measured between the input of the first high voltage switch and the second voltage reference, while preventing a high voltage from being applied across the gate and source of the first and second high voltage switches.

The features, utilities and advantages of the various embodiments of the invention will be apparent from the following more particular description of embodiments of the invention as illustrated in the accompanying drawings.

DETAILED DESCRIPTION

Figure 3:
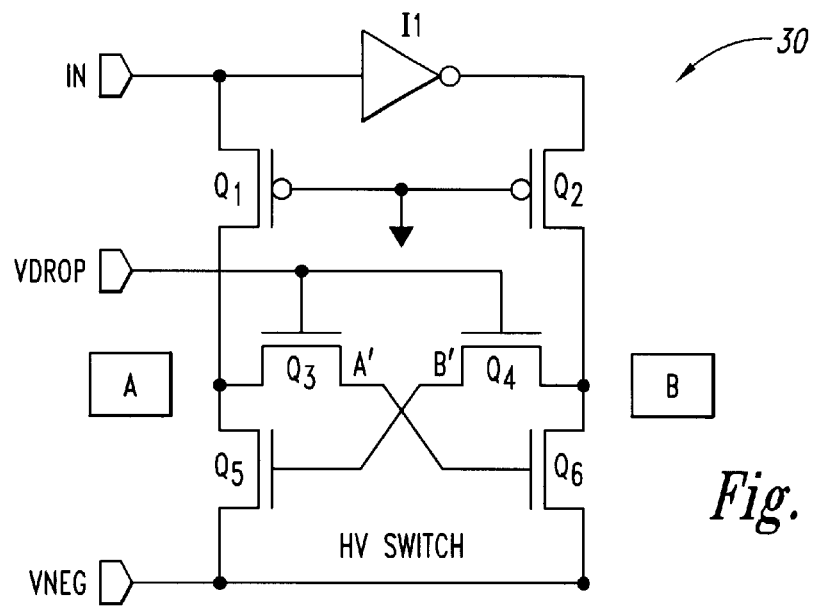
FIG. 3 illustrates a level shifting circuit in accordance with one embodiment of the present invention.

FIG. 3 illustrates a circuit 30 for shifting a signal from a first voltage level to a second voltage level, referenced to a second voltage reference, in accordance with one embodiment of the present invention. In one example, the first voltage level can be 0 volts or +5 volts, representing logic low and logic high, respectively, referenced to a first voltage reference such a ground. The second voltage level may be −5 volts to +5 volts, in one example, representing logic low and logic high, respectively, when referenced to a second voltage reference of, for example, −5 volts.

Figure 5:
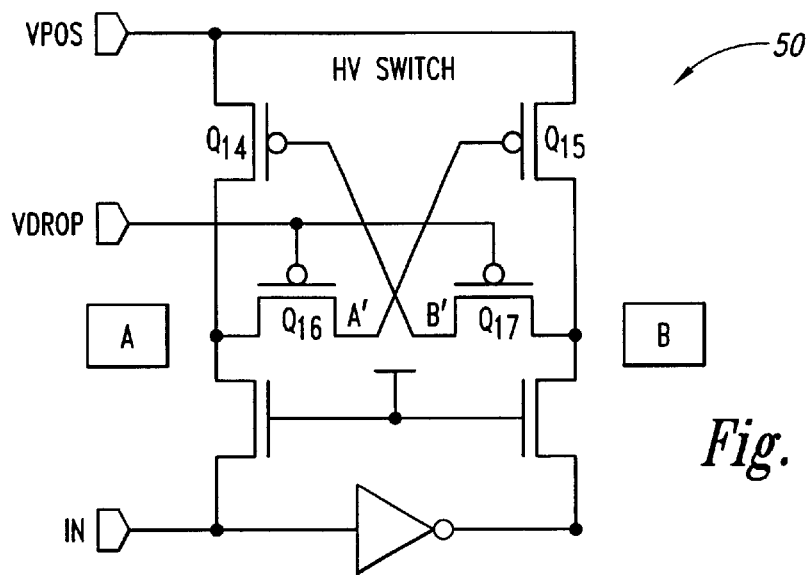
FIG. 5 illustrates an alternative embodiment of a level shifting circuit in accordance with one embodiment of the present invention, wherein p-channel transistors are used on the output of the circuit with reference to a VPOS voltage reference.

As will be explained below, the circuit 30 of FIG. 3 provides the level shifting function while reducing the gate-to-source voltage applied to transistors (Q5) and (Q6), in one example. FIG. 5 illustrates a complementary circuit for performing the level shifting function while reducing the gate-to-source voltage applied to transistors (Q14) and (Q15), in one example.

As used herein, the term "transistor" or "switch" includes any switching element which can include, for example, n-channel or p-channel CMOS transistors, MOS-FETs, FETs, JFETS, BJTs, or other like switching element or device. The particular type of switching element used is a matter of choice depending on the particular application of the circuit, and may be based on factors such as power consumption limits, response time, noise immunity, fabrication considerations, etc. Hence while embodiments of the present invention are described in terms of p-channel and n-channel transistors, it is understood that other switching devices can be used.

Further, embodiments of the present invention are described in terms of a circuit which utilizes logic levels of 0 volts (logic low) and +5 volts (logic high), where a high voltage signal can include voltages such as −5 volts or +10 volts. It is understood that embodiments of the present invention can be utilized in circuits wherein the logic levels and high voltage levels are different, such as in a circuit which utilizes logic levels of 0 volts (logic low) and +3 volts (logic high), where a high voltage signal can include voltages such as −7 volts or +13 volts, in one example.

Referring to FIG. 3, an input signal IN acts as an input to the circuit 30 and can be at a low logic level (such as 0 volts) or a high logic level such as +5 volts.

The signal VNEG is a high voltage reference signal, which in this example goes from ground (0 volts) to its high voltage level of −5 volts. VNEG is initially at zero volts and is driven below ground to −5 volts, in one example, by a circuit (not shown) such as a pump circuit, a driver circuit, or an external supply.

The input signal VDROP is a control signal which indicates that the VNEG signal has reached a voltage level of outside of the logic levels of the circuit. In one example, the VDROP signal is active when the VNEG signal is below 0v, such as at a level of −2VTN (where VTN is the threshold voltage for an n-channel transistor). In one example, the VDROP signal is provided by the circuit of FIG. 4. FIG. 5 shows a complementary circuit for generating the VDROP signal to detect the level of a VPOS high voltage reference signal when VPOS has reached a voltage level of outside of the logic levels of the circuit, such as above +5 volts.

Referring again to FIG. 3, the output signals are taken across the (A to VNEG) node, which will be 10 volts in one example; or across the (B to VNEG) node, wherein the B node has a logic state which is the complement of the A node, in one example. The A node follows the logic state present at the input IN, while the B node is the inverted state of the input signal IN. The output signal of this circuit can be used to program or erase one or more cells in a non-volatile memory.

Transistor (Q1) has the source coupled with the logic level input IN, the gate coupled with ground, and the drain coupled with the output A node. Transistor (Q2) has the source coupled with the inverted logic level input IN (through inverter I1), the gate coupled with ground, the drain coupled to output node B. Transistor (Q3) has its gate coupled with the VDROP control signal, the drain coupled with the output node A, and the source coupled with the gate of transistor (Q6). Transistor (Q4) has its gate coupled with the VDROP control signal, the drain coupled with the output node B, and the source coupled with the gate of transistor (Q5).

Transistor (Q5) has the drain coupled with output node A, the gate coupled with the source of transistor (Q4), and the source coupled with the VNEG signal. Transistor (Q6) has the drain coupled with output node B, the gate coupled with the source of transistor (Q3) and the source of transistor (Q6) is coupled with the VNEG signal. The transistors (Q5) and (Q6) form a high voltage output switch of the level shifting circuit of FIG. 3. In one example, the P-well connections of transistors (Q3), (Q4), (Q5), and (Q6) are coupled with the VNEG line.

In overall operation, the circuit 30 of FIG. 3 limits the maximum gate to source voltage on transistors (Q5) and (Q6) to the magnitude of the VNEG signal (i.e., 5 volt magnitude), while still providing a 10 volt swing between the output nodes A, B and the VNEG signal so that this 10 volt output swing can be used to program a non-volatile memory cell. In this manner, degradation of transistors (Q5) and (Q6) during level shifting operations is reduced.

Generally, the signal VNEG begins at a voltage ground level and the input signal IN is at a desired logic input level. Initially, the control signal VDROP is at a high level such as +5 volts. The VNEG signal is then driven below ground, and after VNEG is adequately below ground, the VDROP signal can be switched to a low logic level (which will be shown in the circuit of FIG. 4). The signal VNEG continues to its final low voltage (i.e., −5 volts). The circuit outputs are taken across node A and VNEG, wherein node A will maintain the voltage applied at the logic level input and wherein node B maintains the complement thereof.

Figure 1:
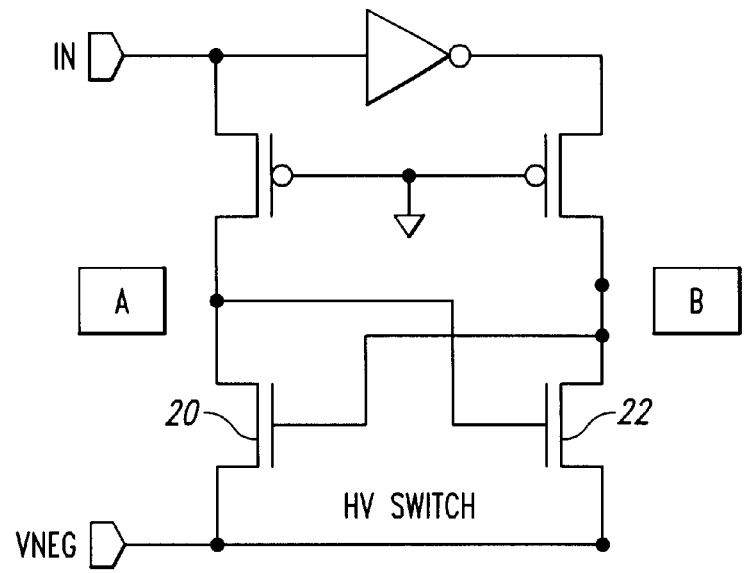
FIG. 1 illustrates a level shifting circuit for shifting the level of the input signal IN to a greater level across n-channel transistors 20 and 22 referenced to a VNEG voltage reference.
Figure 2:
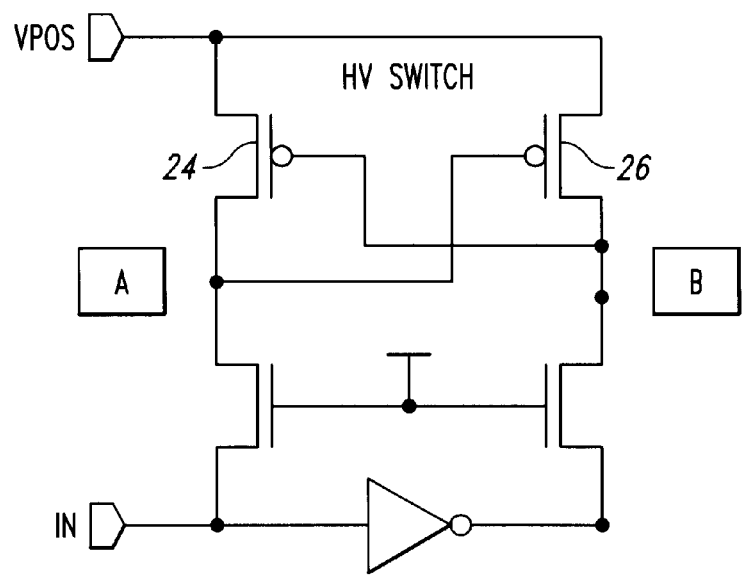
FIG. 2 illustrates an example of a level shifting circuit for shifting an input signal IN to a greater voltage value across the p-channel transistors 24 and 26 referenced to the VPOS voltage.

When the input signal IN is +5 volts and VNEG is −5 volts, the value measured across the (A-VNEG) node is 10 volts. Hence, it can be seen that the circuit of FIG. 3 shifts the input signal to a higher voltage. Conversely, if the input signal IN goes low, (i.e., to 0 volts), the circuit of FIG. 3 would provide an output voltage shifted to a higher level voltage (i.e., −5 volts) measured between output node A and VNEG. The gate to source voltage on transistor (Q5) is approximately 5 volts, instead of 10 volts in the circuit of FIG. 1.

The operations of the circuit 30 of FIG. 3 will be described with reference to Table 2.

TABLE 2

|  | Q1 | Q2 | Q3 | Q4 | Q5 | Q6 |
|---|---|---|---|---|---|---|
| Time T0 | ON | OFF | ON | ON | OFF | ON |
| Time T1 | ON | OFF | ON | ON | OFF | ON |
| Time T2 | ON | OFF | Weakly ON | ON | OFF | ON |
| Time T3 | ON | OFF | Weakly ON | ON | OFF | ON |

Assume that the logic level input signal IN is at +5 volts at time T0. At time T0, VNEG begins at 0 volts, and VDROP is inactive at a high level such as +5 volts. Since the input signal IN is at +5 volts, then the source of transistor (Q1) is at 5 volts and the source of transistor (Q2) is at 0 volts. As shown in Table 2, transistor (Q1) is on so that its drain is at +5 volts, and transistor (Q2) is off so that its drain is at ground. Since the control signal VDROP is at +5 volts, transistors (Q3) and (Q4) are on, so that the +5 volts at the drain of transistor (Q3) are present at its source which is coupled with the gate of transistor (Q6). Because the gate of transistor (Q6) is high, transistor (Q6) is on. Similarly, transistor (Q4) has the VDROP control signal applied to its gate, and accordingly transistor (Q4) is on. Because the drain of transistor (Q4) is at 0 volts (low logic level), the source of transistor (Q4) is also low which is applied to the gate of transistor (Q5), and therefore transistor (Q5) is off.

The output of the circuit 30 of FIG. 3 is taken across node A and VNEG, or across node B and VNEG, wherein the output voltage at node A is +5 volts, and the output voltage at node B is the complement of node A. The voltage difference across node A and VNEG is 5 volts in magnitude.

At time T1, VNEG begins to be driven from 0 volts to −5 volts, indicating that a control signal has been passed to the VNEG generator enabling the VNEG generator to transition its VNEG voltage from 0 to −5 volts. At time T1, VNEG is therefore at some negative potential between 0 and −5 volts. The VDROP signal is at +5 volts and accordingly, at time T1 and as shown in Table 2, transistor (Q1) is on, transistor (Q2) is off, transistor (Q3) is on, transistor (Q4) is on, transistor (Q5) is off, and transistor (Q6) is on, and therefore the voltage at output node A is +5 volts. Hence, >5 volts magnitude is present across the A to VNEG node, while the gate to source voltage on transistor (Q6) is (5−VTN−VNEG) volts, while the gate to source voltage on transistor (Q5) is 0 volts.

At time T2, assume that VDROP goes from +5 volts to 0. When VNEG reference signal goes to a voltage of −V2, wherein −V2 is more negative than −V but more positive than −5 volts. In this instance, and assuming that the logic level input IN is still at +5 volts, the transistors are in the state indicated in Table 2. Transistor (Q1) is on and transistor (Q2) is off, while transistor (Q3) is weakly on, transistor (Q4) is on, and transistor (Q5) is off, and transistor (Q6) is on.

At time T3, when VDROP is 0 volts and VNEG reaches a voltage of −5 volts (still assuming the logic level input IN is at +5 volts), transistor (Q1) is on, transistor (Q2) is off, and transistor (Q3) is weakly on. Transistor (Q4) turns on because its gate is at VDROP (0 volts) and its source is at VNEG (−5 volts), thus its gate to source voltage is 5 volts. Transistor (Q5) remains off, and transistor (Q6) remains on. On transistor (Q6), the maximum gate to source voltage is equal to 5 volts minus the threshold voltage VTH, which provides a reduction in the gate to source voltage seen by transistor (Q6) when compared with the circuit of FIG. 1. In this manner, transistor (Q6) is subjected to less potential for degradation due to high gate to source voltages applied thereto. As to transistor (Q4), the maximum gate to source voltage is equal to 0 minus 5 volts.

Figure 4:
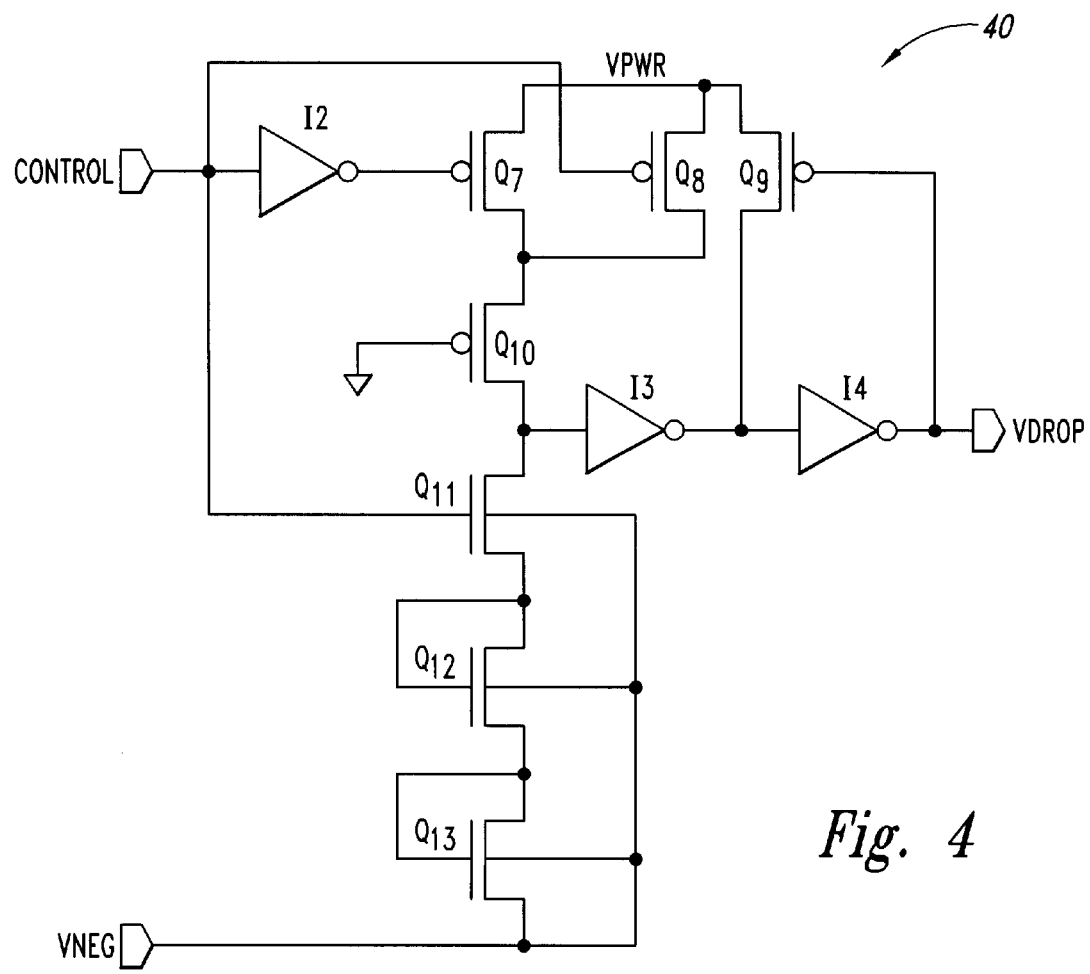
FIG. 4 illustrates a circuit for detecting a change in the value of the reference voltage VNEG, in accordance with one embodiment of the present invention.

Referring now to FIG. 4, FIG. 4 illustrates a circuit 40 for generating a voltage drop control signal VDROP based on a control input (CONTROL) and a generated negative voltage VNEG, in accordance with one embodiment of the present invention. The circuit 40 provides the VDROP signal to switch from +5 volts to 0 volts when the VNEG input signal reaches a voltage level of −V2. In this manner, the circuit of FIG. 4 provides the VDROP signal to controllably indicate the occurrence of this event.

Referring to FIG. 4, transistor (Q7) has its gate coupled with the control signal through inverter I2, while its source is coupled with the sources of transistors (Q8) and (Q9). The drain of transistor (Q7) is coupled with the drain of transistor (Q8), which is also coupled to the source of transistor (Q10). Transistor (Q8) has its gate coupled with the control signal, while transistor (Q9) has its gate coupled with the output VDROP, and its drain coupled with the output of inverter I3. Inverter I4 is coupled between the drain and the gate of transistor (Q9).

Transistor (Q10) has its gate coupled with ground, and its drain coupled to the input of inverter I3 and to the drain of transistor (Q11). Transistor (Q11) has its gate coupled with the control signal, and its source coupled with the gate and the drain of transistor (Q12). Transistor (Q12) has its source coupled with both the gate and the drain of transistor (Q13). Transistor (Q13) has its source coupled with the VNEG generated signal. In one embodiment, the P-well connections for transistors (Q11), (Q12), and (Q13) are coupled with the VNEG generated signal. In operation, the circuit 40 of FIG. 4 provides the VDROP signal to switch from +5 volts to 0 when the VNEG generated signal goes from 0 volts to a level such as −V2, which in one example is at least −2VTN.

The control signal is an input signal which is the same signal that instructs the VNEG generator (not shown) to begin generating a voltage of −5 volts. Therefore, when the control signal is active, the VNEG generator begins to generate a negative voltage, and as the VNEG voltage signal reaches the level of minus V2, the VDROP signal accordingly indicates the occurrence of this event. Hence, the VDROP signal can be viewed as a signal which indicates the detection that the VNEG generated signal has reached a particular desired level.

The operations of circuit 40 in FIG. 4 will now be described with reference to Table 3.

TABLE 3

|  | Q7 | Q8 | Q9 | Q10 | Q11 | Q12 | Q13 |
|---|---|---|---|---|---|---|---|
| Time T0 | OFF | ON | OFF | ON | OFF | OFF | OFF |
| Time T1 | ON | OFF | OFF | ON | OFF | OFF | OFF |
| Time T2 | ON | OFF | ON | ON | ON | ON | ON |
| Time T3 | ON | OFF | ON | ON | ON | ON | ON |

At time T0, the control voltage is assumed to be at 0 volts, and the VPWR signal illustrated is at a logic level of +5 volts, the VNEG signal begins initially at 0 volts, and the VDROP signal is at +5 volts. Because the control signal is at 0 volts, transistor (Q7) is off, transistor (Q8) is on. Since transistor (Q10) is on, and the source of transistor (Q10) is at 5 volts, the output voltage VDROP is also at 5 volts (since transistors (Q11), (Q12), and (Q13) are all off).

At time T1, assume that the control signal is now +5 volts and accordingly, VNEG is at a voltage of −V which is between 0 and −V2 volts. Since the control signal is at +5 volts, transistor (Q7) is on and transistor (Q8) is off. Since transistor (Q10) is on, the VDROP output signal remains at +5 volts since transistors (Q11), (Q12), and (Q13) are off.

At time T2, assume that the control signal remains at 5 volts, but the VNEG voltage has reached −V2 which is more negative than V1 but not yet at −5 volts. Because the control signal is at +5 volts, transistor (Q7) is on and transistor (Q8) is off. Transistor (Q9) and (Q10) are on, and accordingly the VDROP signal goes from +5 volts to a low logic level of 0 volts.

At time T3, assuming the control signal remains at +5 volts, and VNEG has now moved more negative to −5 volts, the state of the transistors is the same as at time T2, in one embodiment, and the output signal VDROP remains at a logic low level of 0 volts.

Accordingly, the output signal VDROP generated by the circuit of FIG. 4 can be used to enable the operation of a level shifter with reduced transistor bias voltages, as shown in FIG. 3, according to one embodiment of the present invention.

Figure 6:
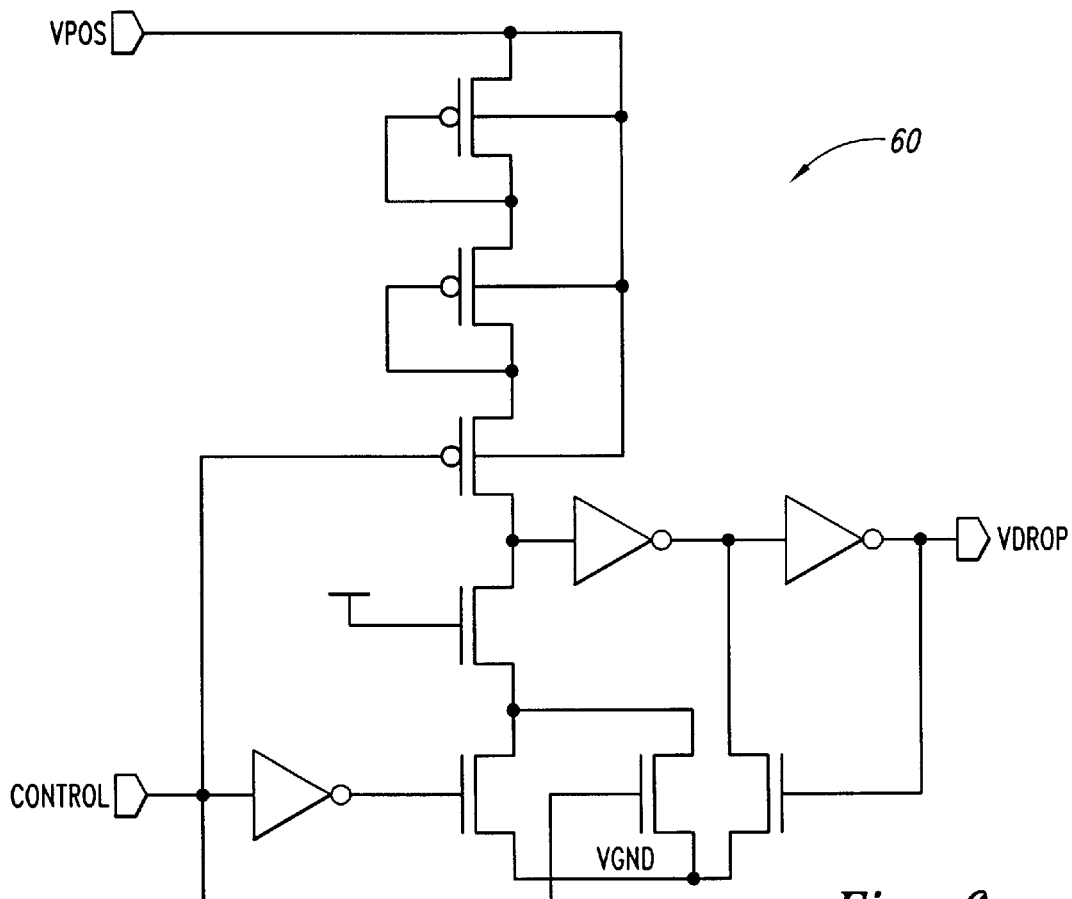
FIG. 6 illustrates a circuit for detecting a change in the value of the VPOS reference voltage, in accordance with one embodiment of the present invention.

FIGS. 5 and 6 illustrate alternative embodiments of the invention, wherein P-channel transistors are used to provide the level shifted high voltage output signals across either the node between A and VPOS or between B and VPOS. The circuit 50 of FIG. 5 operates in a manner similar to the circuit 30 of FIG. 3, in that the switching transistors (Q14) and (Q15) are not subjected to a high voltage gate to source voltages during level shifting operations due to the introduction of the P-channel series transistors (Q16) and (Q17) controlled by the VDROP signal, in one embodiment.

FIG. 6 illustrates a circuit 60 for generating a VDROP signal to the series transistors (Q16) and (Q17) of FIG. 5 in accordance with one embodiment of the present invention. Circuit 60 of FIG. 6 operates in a manner similar to circuit 40 of FIG. 4 described above. In FIG. 6, the VDROP control signal is generated when the VPOS high voltage reference signal reaches a level such as between +5 and +10 volts, or more specifically, when VPOS is higher than VCC+2VTP volts.

Embodiments of the present invention can be used in a variety of circuits where level shifting may be used, such as in non-volatile memory circuits, or programmable logic devices. For instance, in a non-volatile memory circuit, embodiments of the present invention may be used to control the application of high voltage write or erase signals to one or more portions of the non-volatile memory.

Figure 7:
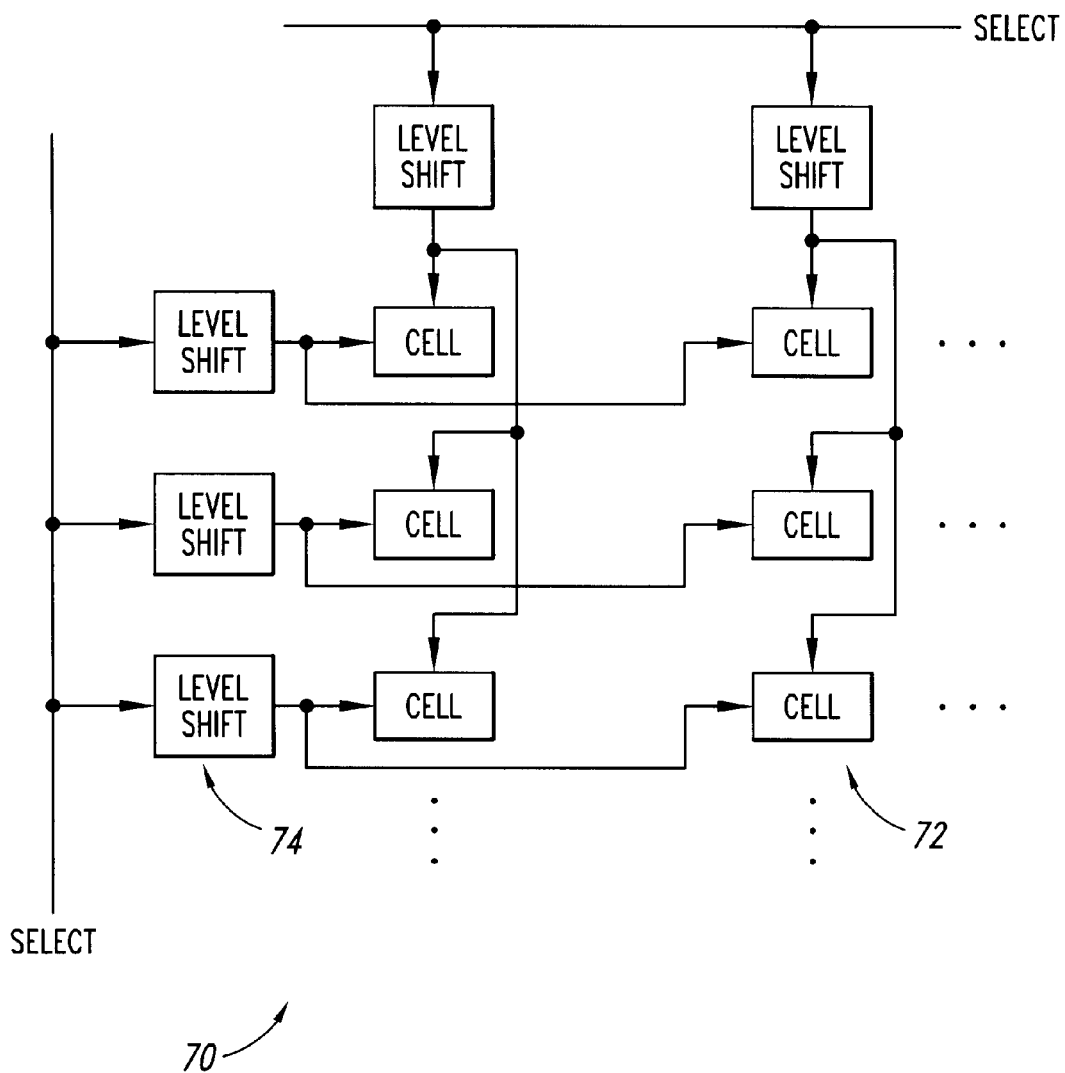
FIG. 7 illustrates an example of a memory device incorporating an embodiment of the present invention.

FIG. 7 illustrates one example of a non-volatile memory 70 having a plurality of memory cells 72 and level shifters 74 according to embodiments of the present invention. In one embodiment, the memory device 70 has a plurality of memory cells, and associated with each row or column of cells is one or more level shifting circuits 74. Under the control of the one or more select lines, the level shifting circuits provide high voltages signals to the memory cells to perform a write or erase operations. One example of a non-volatile memory device is described in commonly owned U.S. Pat. No. 5,506,816, entitled "Memory Cell Array Having Compact Word Line Arrangement," issued on Apr. 9, 1996, the disclosure of which is expressly incorporated herein by reference in its entirety.

While the methods disclosed herein have been described and shown with reference to particular operations performed in a particular order, it will be understood that these operations may be combined, sub-divided, or re-ordered to form equivalent methods without departing from the teachings of the present invention. Accordingly, unless specifically indicated herein, the order and grouping of the operations is not a limitation of the present invention.

While the invention has been particularly shown and described with reference to embodiments thereof, it will be understood by those skilled in the art that various other changes in the form and details may be made without departing from the spirit and scope of the invention.

What is claimed is:

1. A circuit for shifting a signal from a first voltage level referenced to a first voltage reference, to a second voltage level referenced to a second voltage reference, the circuit comprising:

a first switch receiving the signal, the first switch having an output;

a second switch receiving an inverted representation of the signal, the second switch having an output;

a third switch receiving the output of the first switch, the third switch having an output;

a fourth switch receiving the output of the second switch, the fourth switch having an output;

a fifth switch referenced to the second voltage reference, the fifth switch having an input coupled with the output of the first switch, the fifth switch having a control coupled with the output of the fourth switch; and a sixth switch referenced to the second voltage reference, the sixth switch having an input coupled with the output of the second switch, sixth switch having a control coupled with the output of the third switch;

wherein when the third switch and the fourth switch are on, the signal is shifted to the second voltage level measured between the input of the fifth switch and the second voltage reference.

2. The circuit of claim 1, wherein when the third switch and the fourth switch are on, the inverted representation of the signal is shifted to the second voltage level measured between the input of the sixth switch and the second voltage reference.

3. The circuit of claim 1, wherein the first switch is a p-channel transistor.

4. The circuit of claim 1, wherein the second switch is a p-channel transistor.

5. The circuit of claim 1, wherein the third switch is a n-channel transistor.

6. The circuit of claim 1, wherein the fourth switch is a n-channel transistor.

7. The circuit of claim 1, wherein the fifth switch is a n-channel transistor.

8. The circuit of claim 1, wherein the sixth switch is a n-channel transistor.

9. The circuit of claim 1, wherein the first voltage level is approximately 5 volts, and the second voltage level is approximately 10 volts.

10. The circuit of claim 1, wherein the first voltage level is approximately 0 volts, and the second voltage level is approximately −5 volts.

11. The circuit of claim 1, wherein the first voltage level is approximately 3 volts and the second voltage level is approximately 6 volts.

12. The circuit of claim 1, wherein the first voltage level is approximately 0 volts, and the second voltage level is approximately −3 volts.

13. The circuit of claim 1, wherein the second voltage reference changes from approximately 0 volts to approximately −5 volts.

14. The circuit of claim 1, further comprising:

means for generating a control signal, said control signal being coupled with and activating the third switch and the fourth switch, said means for generating responsive to the second voltage reference.

15. The circuit of claim 14, wherein the means for generating the control signal detects when the second reference voltage is between 0 and −5 volts.

16. The circuit of claim 1, wherein the first switch is a n-channel transistors.

17. The circuit of claim 1, wherein the second switch is a n-channel transistor.

18. The circuit of claim 1, wherein the third switch is a p-channel transistor.

19. The circuit of claim 1, wherein the fourth switch is a p-channel transistor.

20. The circuit of claim 1, wherein the fifth switch is a p-channel transistor.

21. The circuit of claim 1, wherein the sixth switch is a p-channel transistor.

22. The circuit of claim 14, wherein the second voltage reference changes from approximately +5 volts to approximately +10 volts.

23. The circuit of claim 22, wherein the means for generating the control signal detects when the second reference voltage is between +5 and +10 volts.

24. A method for shifting a signal from a first voltage level referenced to a first voltage reference, to a second voltage level referenced to a second voltage reference, the method comprising:

providing a first switch receiving the signal, the first switch having an output;

providing a second switch receiving an inverted representation of the signal, the second switch having an output;

providing a first high voltage switch referenced to the second voltage reference, the first high voltage switch having an input coupled with the output of the first switch and having a control;

providing a second high voltage switch referenced to the second voltage reference, the second high voltage switch having an input coupled with the output of the second switch and having a control;

providing a third switch coupled with the output of the first switch and the control of the second high voltage switch, the third switch responsive to the second reference voltage; and providing a fourth switch coupled with the output of the second switch and the control of the first high voltage switch, the fourth switch responsive to the second reference voltage;

so that when the third switch and the fourth switch are on, the signal is shifted to the second voltage level measured between the input of the first high voltage switch and the second voltage reference.

25. The method of claim 24, further comprising:

providing a control signal which indicates when the reference voltage is at a level between approximately 0 and approximately −5 volts, said control signal controlling the third switch and the fourth switch.

26. The method of claim 24, further comprising:

providing a control signal which indicates when the reference voltage is at a level between approximately 0 and approximately +5 volts, said control signal controlling the third switch and the fourth switch.

* * * * *